(12) United States Patent
Liao

(10) Patent No.: US 10,073,497 B1
(45) Date of Patent: Sep. 11, 2018

(54) DISPLAY DEVICE

(71) Applicants: Inventec (Pudong) Technology Corporation, Shanghai (CN); INVENTEC CORPORATION, Taipei (TW)

(72) Inventor: Pin-Hsiung Liao, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/851,698

(22) Filed: Dec. 21, 2017

(30) Foreign Application Priority Data

Nov. 10, 2017 (CN) .......................... 2017 1 1103622

(51) Int. Cl.
| | |
|---|---|
| *H05K 1/00* | (2006.01) |
| *G06F 1/16* | (2006.01) |
| *H05K 1/14* | (2006.01) |
| *G09G 5/00* | (2006.01) |
| *H05K 1/02* | (2006.01) |
| *G02F 1/1345* | (2006.01) |

(52) U.S. Cl.
CPC .......... *G06F 1/1683* (2013.01); *G09G 5/006* (2013.01); *H05K 1/0271* (2013.01); *H05K 1/14* (2013.01); *G02F 1/13452* (2013.01); *G09G 2300/0426* (2013.01); *G09G 2370/16* (2013.01); *H05K 2201/10136* (2013.01)

(58) Field of Classification Search
USPC ........................................ 361/749, 748, 757
See application file for complete search history.

(56) References Cited

U.S. PATENT DOCUMENTS

| | | | |
|---|---|---|---|
| 2012/0194985 A1* | 8/2012 | Renteria Villagomez ................... | G06Q 30/04 361/679.02 |
| 2016/0202668 A1* | 7/2016 | Chen ...................... | G04G 21/04 368/10 |

* cited by examiner

*Primary Examiner* — Andargie M Aychillhum
(74) *Attorney, Agent, or Firm* — CKC & Partners Co., Ltd.

(57) ABSTRACT

A display device is provided. The display device includes a first housing, a display module, a system circuit board, a first wireless transmission circuit board, and a second wireless transmission circuit board. The first housing has a back cover. The display module is disposed in the first housing, and the display module has a first surface capable of display images and a second surface opposite to the first surface. The second surface faces the back cover. The display module includes a display circuit board. The first wireless transmission circuit board is electrically connected to the system circuit board. The second wireless transmission circuit board is electrically connected to the display circuit board. The first wireless transmission circuit board is configured to transmit a first signal and a first voltage to the second wireless transmission circuit board.

8 Claims, 3 Drawing Sheets

100

DISPLAY DEVICE

CROSS-REFERENCE TO RELATED APPLICATION

This application claims priority to Chinese Application Serial Number 201711103622.7, filed Nov. 10, 2017, which is herein incorporated by reference.

BACKGROUND

Field of Invention

The present invention relates to a display device. More particularly, the present invention relates to a display panel of a display device.

Description of Related Art

Nowadays, for the display module in the display device to work, the system circuit board is connected to the circuit board of the display module (display circuit board) via wires pass behind the display module (pass from a side opposite to a side displaying images). As a result, there are ports (or connectors) for the wires to connect to, and the ports are disposed on the display circuit board and the system circuit board correspondingly.

There are several problems induced by the aforementioned connecting method. First, it's possible that the wires might be dropped off from the ports in manufacturing processes, such as during the assembling process and the transporting process, resulting in a bad voltage transmission or a bad signal transmission. Second, the ports and the wires will occupy physical space. Wiring behind the display module means that a gap should be preserved between the back cover and the display module for the wires to pass, and thus increasing the thickness of the display device. Third, when the display device is extruded by an external force, the wires will further extrude its passing area, and correspondingly causing problems on the panel, such as muras or ruptures.

SUMMARY

The invention provides a display device. The display device includes a first housing, a display module, a system circuit board, a first wireless transmission circuit board, and a second wireless transmission circuit board. The first housing has a back cover. The display module is disposed in the first housing, and the display module has a first surface capable of displaying images and a second surface opposite to the first surface. The second surface faces the back cover. The display module includes a display circuit board. The first wireless transmission circuit board is electrically connected to the system circuit board. The second wireless transmission circuit board is electrically connected to the display circuit board. The first wireless transmission circuit board is configured to wirelessly transmit a first signal and a first voltage to the second wireless transmission circuit board.

In some embodiments, the display device further includes a host module including a second housing and the system circuit board is disposed in the second housing.

In some embodiments, the host module is pivotally connected to an edge of the back cover.

In some embodiments, the host module is separated from the back cover.

In some embodiments, the host module further includes a transformer electrically connected to the system circuit board and configured to transform a voltage provided by an external voltage source into a working voltage and provide the working voltage to the system circuit board.

In some embodiments, the host module further includes a battery electrically connected to the system circuit board and configured to provide a working voltage to the system circuit board.

In some embodiments, the display device further includes a video module disposed on the first housing.

In some embodiments, the video module includes a third wireless transmission circuit board, in which that the first wireless transmission circuit board is configured to wirelessly transmit a second voltage and a second signal to the third wireless transmission circuit board.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
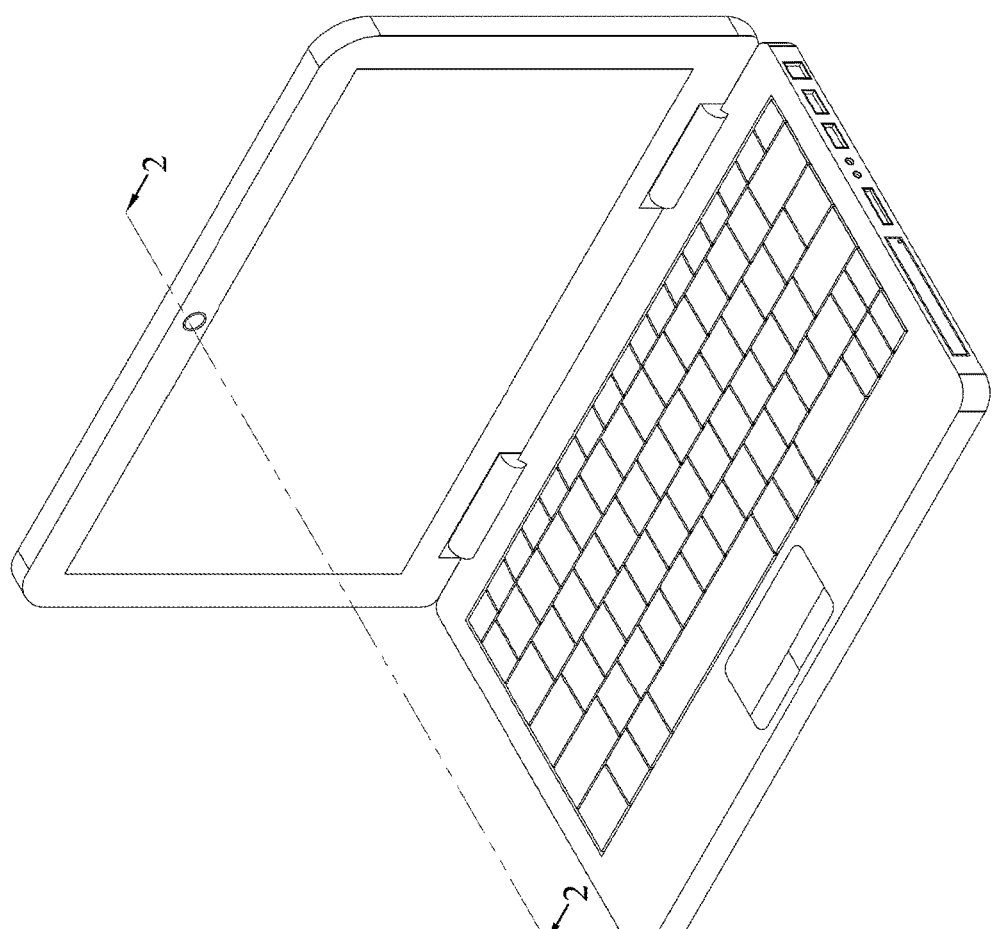
FIG. 1 illustrates a display device according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1. FIG. 1 illustrates a display device 100 according to an embodiment of the present disclosure. The display device 100 is provided as a notebook in the embodiment shown in FIG. 1, but in other embodiments, the display device 100 may be a desktop computer, television, or any other display device including a display panel. It should be understood that the display device 100 in the present disclosure may be referred to any device including a display panel.

Figure 2:
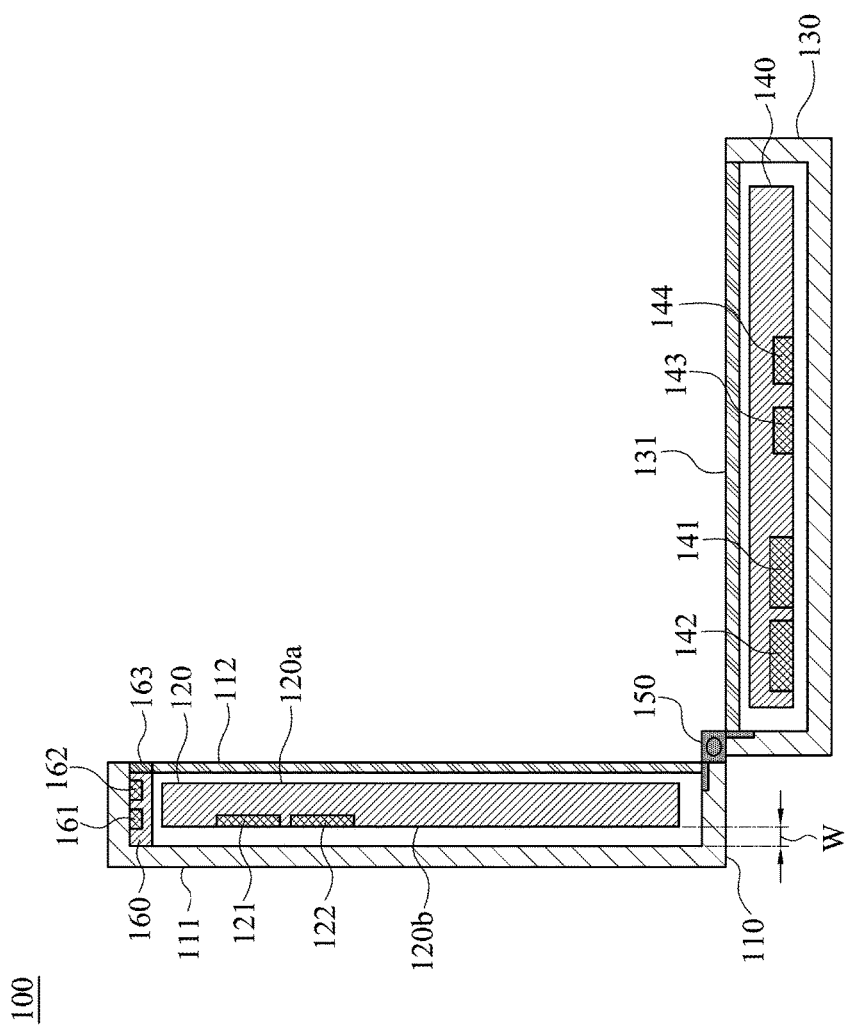
FIG. 2 illustrates a cross-section view of the display device taken along line 2-2 in FIG. 1.
Figure 3:
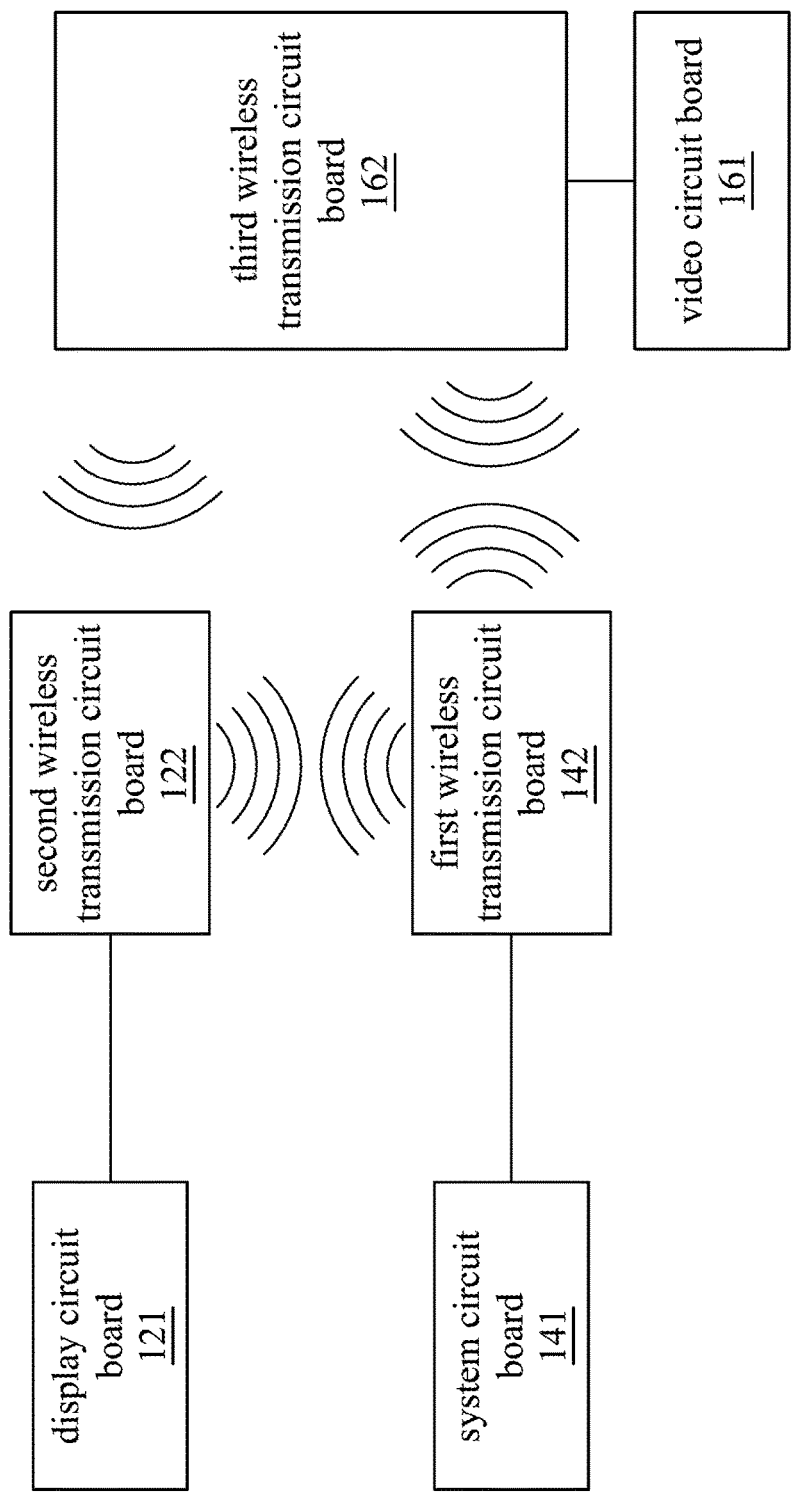
FIG. 3 illustrates a functional diagram of some elements in the display device shown in FIG. 2.

Reference is made to FIG. 2 and FIG. 3. FIG. 2 illustrates a cross-section view of the display device 100 taken along line 2-2 in FIG. 1. FIG. 3 illustrates a functional diagram of elements in the display device 100 shown in FIG. 2. In particular, FIG. 3 is mainly used to show signal transmission relationships among some elements in FIG. 2.

As shown in FIG. 2, the display device 100 of the present disclosure includes a first housing 110, a display module 120, a second housing 130, and a host module 140. The first housing 110 as a whole is box-shaped and includes a back cover 111 and a panel 112. The display module 120 has a first surface 120a capable of displaying images and a second surface 120b opposite to the first surface 120a. The display module 120 is disposed in the first housing 110, in which the first surface 120a faces towards the panel 112 and the second surface 120b faces towards the back cover 111. The second housing 130 as a whole is also box-shaped and includes an input module 131, and the host module 140 is disposed in the second housing 130. For example, the input module 131 may be a keypad module, or any device provided for users to input.

As the embodiment shown in FIG. 2, the panel 112 is a transparent glass material. In other embodiments, the panel 112 may be a protective layer made of any suitable transparent material. In the embodiment shown in FIG. 2, the display module 120 may be a liquid crystal display (LCD) module. In other embodiments, the display module 120 may be an organic light emitting diode (OLED) display module. By the aforementioned configuration, users may watch colorful images displayed on the first surface 120a of the display module 120.

As shown in FIG. 2 and FIG. 3, the display module 120 includes a display circuit board 121 and a second wireless transmission circuit board 122 electrically connected to the display circuit board 121, and the host module 140 includes a system circuit board 141 and a first wireless transmission circuit board 142 electrically connected to the system circuit board 141. The system circuit board 141 of the host module 140 is connected to the display circuit board 121 through the first wireless transmission circuit board 142 and the second wireless transmission circuit board 122. The system circuit board 141 of the host module 140 may control the on-and-off of the display circuit board 121, provide a working voltage to the display circuit board 121, and control the brightness of each pixel in the display module 120.

In the embodiment shown in FIG. 2, the display module 120 adopts the liquid crystal display principle. The display circuit board 121 will control the on-and-off of the back light module (not shown) in the display module 120. In addition, the display circuit board 121 will send voltages to signal lines (not shown) chronologically, and send voltages to data lines (not shown) according to external data (e.g., data received from the system circuit board 141). The brightness of a pixel may be controlled by a corresponding signal line and a corresponding data line. When the corresponding signal line and the corresponding data line are both applied with a voltage, polarization direction of the liquid crystal molecules disposed between the pixel electrodes will be changed, allowing the light emitted by the back light module to pass through the liquid crystal molecules, so as to control the brightness of each pixel.

In a conventional display device, the host module will be electrically connected to the display circuit board via physical wires. However, in the embodiment shown in FIG. 2 and FIG. 3, the host module 140 and the display circuit board 121 are connected with each other via the first wireless transmission circuit board 142 and the second wireless transmission circuit board 122. The first wireless transmission circuit board 142 may transmit a working voltage and signals to the second wireless transmission circuit board 122, so as to allow the display circuit board 121 connected to the second wireless transmission circuit board 122 to operate without connecting to physical wires.

As shown in FIG. 2, the second wireless transmission circuit board 122 is located on a surface in the display module 120 near the second surface 120b. In some embodiments, the second wireless transmission circuit board 122 is located on the second surface 120b. It should be understood that, in general, ports of the display circuit board 121 configured to connect the wires will be disposed on the second surface 120b, so as to avoid an adverse effect to the images quality if the wires pass through the first surface 120a. As a result, by disposing the second wireless transmission circuit board 122 at a location where is originally designed for the ports, the wire-free design of the display panel in the present disclosure may be easily achieved without significantly changing the original design. It should be understood that, in other configurations, the display circuit board 121 and the second wireless transmission circuit board 122 may be located at different locations in the display module 120. For example, the display circuit board 121 and the second wireless transmission circuit board 122 may be located outside of the display module 120, may be separated from each other and connected to each other through a wire, or may be a motherboard and a daughter board relative to each other. People with ordinary skill in the art may dispose the display circuit board 121 and the second wireless transmission circuit board 122 according to operation need of the display module 120 without any limitation.

In the embodiment shown in FIG. 2, the first housing 110 and the second housing 130 of the display device 100 are pivotally connected with each other via a pivoting part 150, so as to allow the first housing 110 to rotate along the pivoting part 150. As such, when the display device 100 is not in use, users may rotate the first housing 110 so as to make the panel 112 abut against the input module 131, thereby reducing space occupied by the display device 100. In particular, the pivoting part 150 may be a hinge, and it should be noted that people with ordinary skill in the art may select any suitable pivoting mechanism according to practical needs. In particular, the pivoting part 150 is located at an edge of the back cover 111. In other embodiments, the display device 100 does not include the pivoting part 150. For example, in an embodiment of a desktop computer, the first housing 110 and the second housing 130 are separated from each other, and thus the pivoting part 150 is not necessary.

As shown in FIG. 2, the host module 140 further includes a transformer 143 and a battery 144. The transformer 143 is electrically connected to the system circuit board 141, and is configured to transform a voltage provided by an external voltage source into a working voltage and provide the working voltage to the system circuit board 141. The battery 144 is electrically connected to the system circuit board 141 and is configured to provide a working voltage to the system circuit board 141.

In the embodiment shown in FIG. 2, the transformer 143 is a 19V transformer, and the battery 144 is a 12V battery. It should be understood that, people with ordinary skill in the art may change the voltage of the transformer 143 and the battery 144 according to practical operation need of the first wireless transmission circuit board 142 and the second wireless transmission circuit board 122. In other embodiments, the first wireless transmission circuit board 142 and the second wireless transmission circuit board 122 may be farther away from each other, so there is more energy loss during the wireless transmission process, and thus the battery 144, the transformer 143, and the system circuit board 141 need to provide a higher voltage to the first wireless transmission circuit board 142. It should be understood that, the actual voltage needed may be obtained from normal experiment methods.

As shown in FIG. 2, the display device 100 further includes a video module 160. In particular, the video module 160 includes a video circuit board 161, a third wireless transmission circuit board 162, and a video camera 163. In the embodiment shown in FIG. 2, the video module 160 is disposed at an end in the first housing 110 distal to the pivoting part 150, so as to allow users to face the video camera 163 of the video module 160 conveniently.

In a conventional display device, a video module is connected to a system circuit board via wires. However, in the embodiment shown in FIG. 2 and FIG. 3, the system circuit board 141 and the video circuit board 161 are connected to each other via the first wireless transmission circuit board 142 and the third wireless transmission circuit board 162. The first wireless transmission circuit board 142 may send a working voltage and signals to the third wireless transmission circuit board 162, so as to allow the video circuit board 161 connected to the third wireless transmission circuit board 162 to operate without connecting to wires. The third wireless transmission circuit board 162 may transmit image signals received by the video circuit board 161 to the first wireless transmission circuit board 142, so as to make the system circuit board 141 store the image signals. The third wireless transmission circuit board 162 may also transmit image signals received by the video circuit board 161 to the second wireless transmission circuit board 122, so as to make the first surface 120*a* of the display module 120 display images received by the video circuit board 161.

Several aspects of the present disclosure are fully and clearly disclosed in FIG. 1 to FIG. 3. People with ordinary skill in the art may implement the display device 100 according to the figures and description provided. By using the first wireless transmission circuit board 142 and the second wireless transmission circuit board 122 to replace physical wires used in conventional designs, the gap width w (referring to FIG. 1) between the display module 120 and the back cover 111 behind the display device 100 may be reduced, and the overall thickness of the display device 100 may be further reduced. In addition, when the display device 100 is extruded by external forces, problems such as mura and rupture can be prevented.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
   a first housing having a back cover;
   a display module disposed in the first housing, and having a first surface capable of display images and a second surface opposite to the first surface, wherein the display module comprises a display circuit board, and the second surface faces towards the back cover;
   a system circuit board;
   a first wireless transmission circuit board electrically connected to the system circuit board; and
   a second wireless transmission circuit board electrically connected to the display circuit board, wherein the first wireless transmission circuit board is configured to wirelessly transmit a first signal and a first voltage to the second wireless transmission circuit board.

2. The display device of claim 1, further comprising:
   a host module comprising a second housing, wherein the system circuit board is disposed in the second housing.

3. The display device of claim 2, wherein the host module is pivotally connected to an edge of the back cover.

4. The display device of claim 2, wherein the host module is separated from the back cover.

5. The display device of claim 2, wherein the host module further comprises a transformer electrically connected to the system circuit board and configured to transform a voltage provided by an external voltage source into a working voltage and provide the working voltage to the system circuit board.

6. The display device of claim 2, wherein the host module further comprises a battery electrically connected to the system circuit board and configured to provide a working voltage to the system circuit board.

7. The display device of claim 1, further comprising a video module disposed on the first housing.

8. The display device of claim 7, wherein the video module comprises a third wireless transmission circuit board, wherein the first wireless transmission circuit board is configured to wirelessly transmit a second voltage and a second signal to the third wireless transmission circuit board.

* * * * *